United States Patent [19]

Chaki

[11] 4,237,740
[45] Dec. 9, 1980

[54] PUSHBUTTON TUNER

[75] Inventor: Takao Chaki, Tokyo, Japan

[73] Assignee: Clarion Co., Ltd., Tokyo, Japan

[21] Appl. No.: 907,402

[22] Filed: May 18, 1978

[30] Foreign Application Priority Data

May 19, 1977 [JP] Japan .............................. 52-63237[U]
Nov. 30, 1977 [JP] Japan ........................... 52-159574[U]

[51] Int. Cl.³ .......................... F16H 35/18; H03J 1/06; G05G 1/02
[52] U.S. Cl. ........................................ 74/10.33; 334/7
[58] Field of Search ................ 74/10.33, 10.37; 334/7

[56] References Cited

U.S. PATENT DOCUMENTS

| 3,463,017 | 8/1969 | Stamm et al. | 74/10.33 |
| 3,554,041 | 1/1971 | Stamm | 74/10.33 |
| 4,079,631 | 3/1978 | Chaki | 74/10.33 |
| 4,143,555 | 3/1979 | Ohashi | 74/10.33 |

*Primary Examiner*—Allan D. Herrmann
*Attorney, Agent, or Firm*—Wallenstein, Spangenberg, Hattis & Strampel

[57] ABSTRACT

A pushbutton tuner having a tuning mechanism connected through a releasable clutch to a manual dial selector and connectable to a pushbutton selector including a button slide and an actuating member, wherein specific means for ensuring the resetting of the button slide is provided to prevent possible locking of the button slide by clutch releasing means.

8 Claims, 11 Drawing Figures

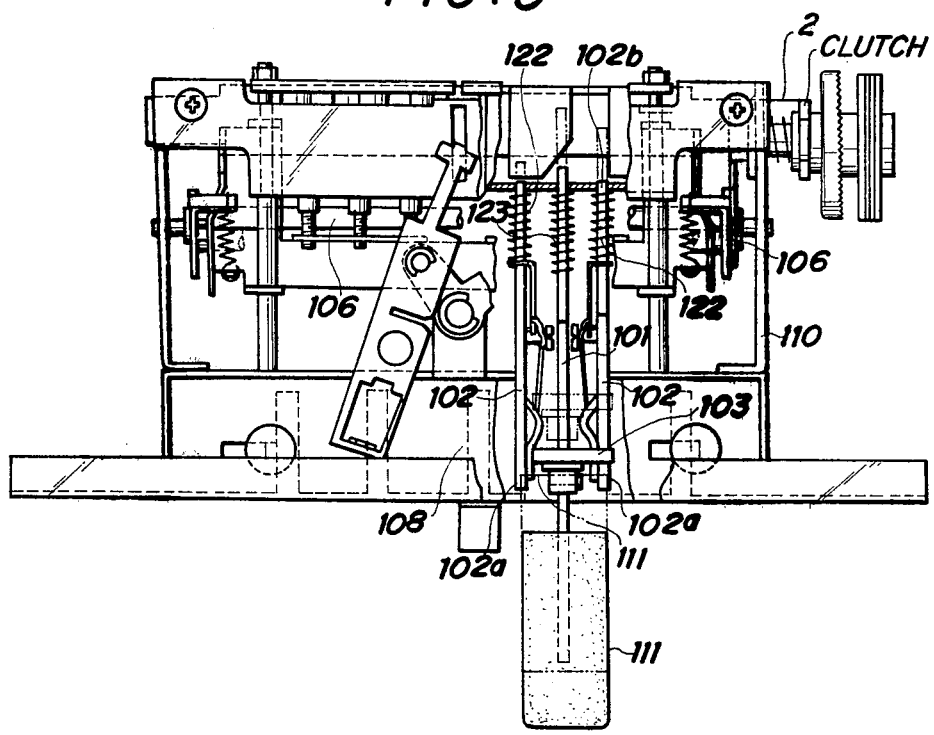
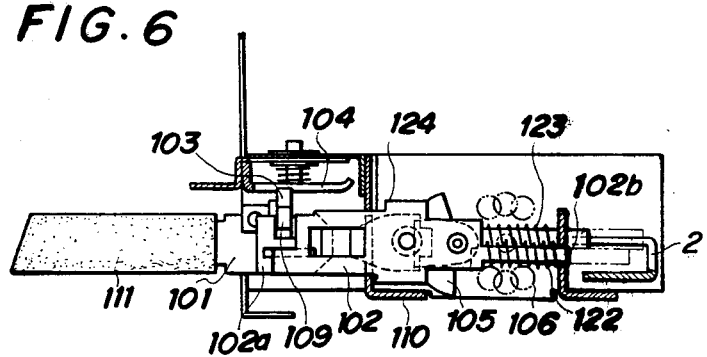

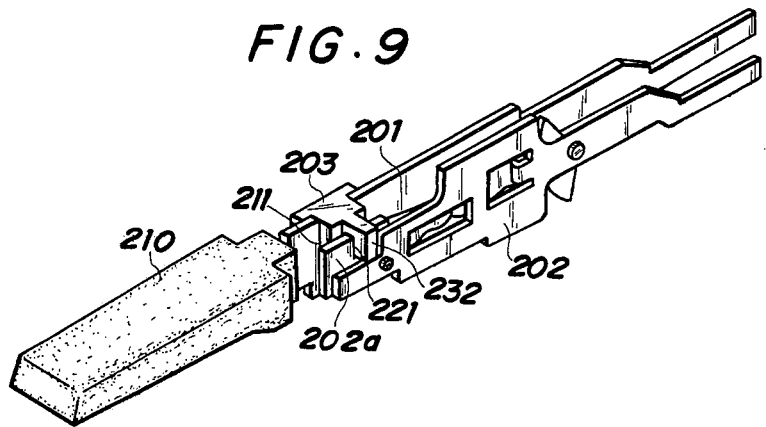
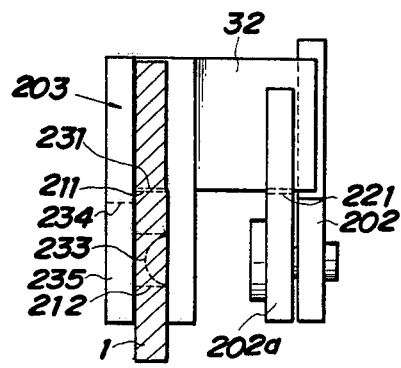
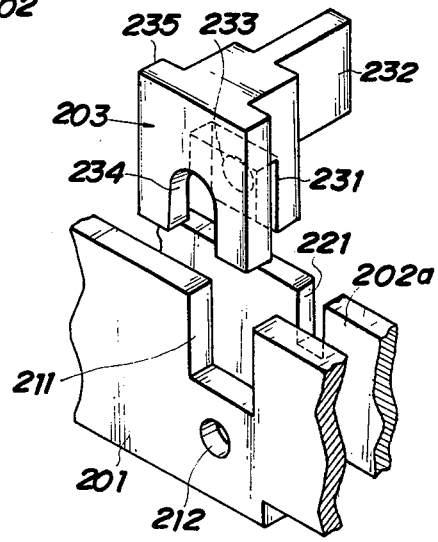

PUSHBUTTON TUNER

BACKGROUND OF THE INVENTION

This invention relates to a pushbutton tuner, and more particularly to a pushbutton tuner in which pushbuttons and pushbutton slides are enabled to return positively and smoothly to their original positions without possibly entangling with other members in a tuner housing.

In the operation of pushbutton selectors for selection of radio stations, it is usual to disconnect a mechanism for a manual dial selector from a tuning mechanism by actuating a clutch releasing mechanism by any of pushbuttons pressed inwardly to release a clutch. Stated illustratively, the inner end of the button slide, when pressed inwardly, engages a cam formed in the clutch releasing mechanism to shift laterally the latter to one side to release the clutch for the selection of radio station as mentioned above. In this connection, it is to be noted that the clutch mechanism has a resilient member to urge the clutch releasing means expelled in one direction, in the opposite direction, for restoration of the clutch to its usual position. Accordingly, the button slide which is pressed inwardly to its retreated position is subjected to a lateral force for restoring the clutch to its original state. Though the button slide is provided with a spring for urging the button slide to its original projected position, the action of the spring is liable to be prevented by said lateral force from restoring the clutch to its original position and the button slide can be caught or locked by the cam of the clutch releasing means or at least prevented from smoothly returning to its original position. Thus, in case the button slide is pressed strongly to its innermost position, the button slide often remains in the pressed retreated position while being prevented from returning to its original position by its entanglement with the cam or other member of the housing.

The inventors of the present invention have considered the possibility of increasing the force of the button slide restoring spring. However, this is difficult or disadvantageous in view of the space problem occasioned by the necessary enlargement of the spring. Furthermore, even if the larger spring is employed, it causes another problem where the larger and stronger spring would hinder the easy smooth depression of the button slide. Furthermore, such a strong spring could make the button slide impact against the housing due to its strong force when the button slide is released, causing loosening of the connection of the pushbutton to the button slide and possible disengagement of the pushbutton from the button slide. This invention provides a solution to these problems with a means which is simple and reliable. The present invention is applicable both to single band and multi-band pushbutton tuner.

SUMMARY OF THE INVENTION

It is therefore an object of the present invention to provide a pushhbutton tuner which is capable of surely and smoothly restoring the pushbutton and button slide to their original positions.

It is another object of the present invention to provide such a tuner which is particularly effective for a multi-band pushbutton tuner.

It is a further object of the present invention to provide a single-band pushbutton tuner as described which is formed of parts, especially button slides and actuating members, made for conventional multi-band pushbutton tuners and a specifically structured part to adapt said parts for conventional multi-band pushbutton tuners to be utilized for a single-band pushbutton tuner.

According to one aspect of the present invention, there is provided in a pushbutton tuner comprising a tuner housing, a tuning mechanism disposed within said housing, a pushbutton selector connectable to said tuning mechanism and including a plurality of button slides disposed sidewise across the front face of the housing and movable rectilinearly between operative projected and inoperative retreated positions and a plurality of actuating members respectively associated with the respective button slides and adapted to be connected to the tuning mechanism when pressed inwardly, a clutch adapted to connect a manual dial selector to the tuning mechanism, and means adapted to release the clutch when any of the button slides is pressed inwardly, the improvement which comprises additional resilient means mounted on the actuating member to urge the button slides to their original projected positions.

BRIEF DESCRIPTION OF THE ACCOMPANYING DRAWINGS

The invention will be better understood from the following description taken in conjunction with the accompanying drawings, in which:

FIG. 5 is a plan view of a multi-band pushbutton tuner according to the present invention which has a portion broken away to more clearly illustrate the invention;

FIG. 6 is a side elevational view of FIG. 5;

FIG. 9 is a perspective view of a pushbutton selector for a single-band pushbutton tuner employable in the present invention;

FIG. 10 is an enlarged view of connecting portion of the pushbutton selector of FIG. 9; and FIG. 11 is a fragmentary perspective exploded view of the connecting portion of FIG. 10.

DESCRIPTION OF THE PREFERRED EMBODIMENT

Figure 1:
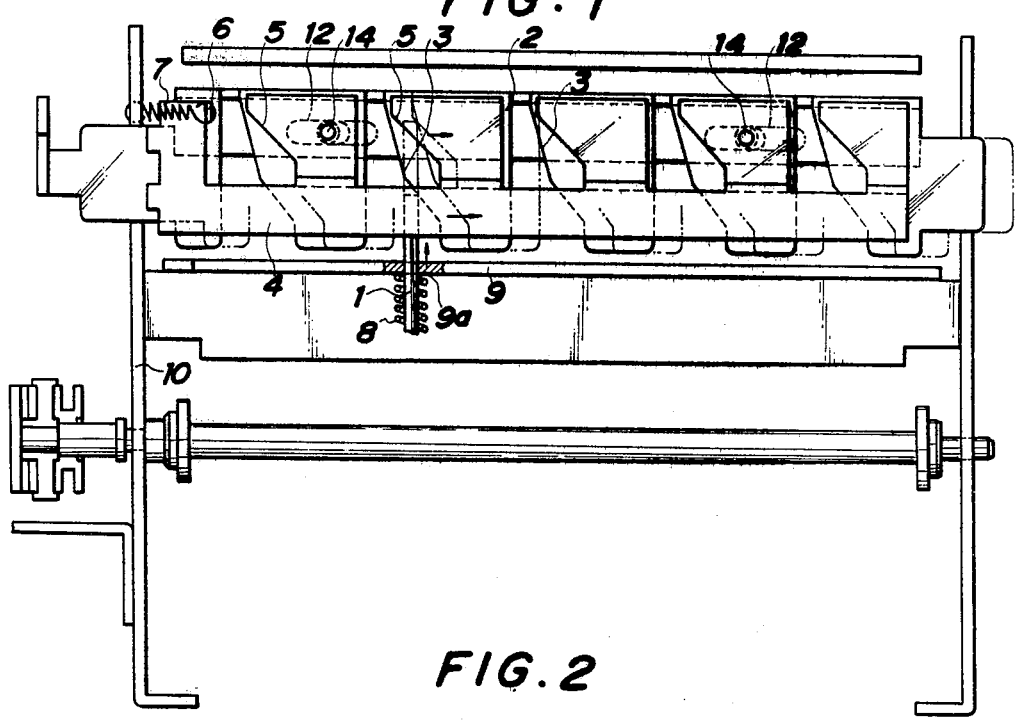
FIG. 1 is a fragmentary plan view of a rear or inner portion of a pushbutton tuner showing one mode of means for surely and smoothly restoring button slides to their original positions according to the present invention.
Figure 2:
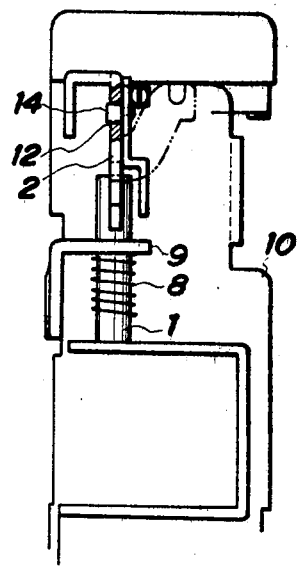
FIG. 2 is a side elevational view of FIG. 1.

Referring now to FIGS. 1 and 2, there is illustrated one preferred form of means for surely and smoothly restoring button slides to their original positions. A plurality of pushbutton selectors comprised of button slides 1 provided with pushbuttons secured thereto at their outer ends and actuating members associated with the button slides are disposed sidewise across the front face of a housing 10 in a conventional fashion. An inner end of each of the button slides 1 is slidably received in an aperture 9a formed in a support plate 9 so as to protrude from said plate 9. A compression spring 8 is positioned about the inner end portion of each of the button slides 1 and rests against said inner support plate 9 to urge the button slide 1 to its original position. Thus, it is to be noted that when the pushbutton is pressed, the button slide is pressed inwardly against the action of the spring 8. Each of the actuating members is adapted to connect to a tuning mechanism within the housing 10 to select a radio station. The tuning mechanism is further connected through a releasable clutch to a manual dial selector. To disconnect the tuning mechanism from the manual dial selector, means 2 for releasing the clutch is provided. This means 2 has a plurality of cam surfaces 3 corresponding to the respective button slides and disposed so as to engage the inner ends of the button slides 1 when pressed inwardly. The means 2 is thus adapted to slidably shift from the left to the right as viewed from FIG. 1 when any of the button slides 1 is pressed inwardly to release the clutch in a conventionally known manner. According to this embodiment, another means 4 for ensuring sure and smooth returning of the button slides without possible locking entanglement of the button slides is slidably attached to the clutch releasing means 2 through engagement of pins 14 thereof with elongated slots 12 formed in said clutch releasing means 2. This means 4 also has cam surfaces 5 at positions engageable with the respective inner ends of the button slides 1. A tension spring 7 is mounted between the housing 10 and a hook provided on the means 4 to urge the means 4 in such a direction as to disengage the button slides 1 from the cam surfaces 3 of the clutch releasing means 2. Thus, the means 4 cooperate with the clutch releasing means 2 to surely and smoothly restore the button slides 1 to their original projected position.

Figure 3:
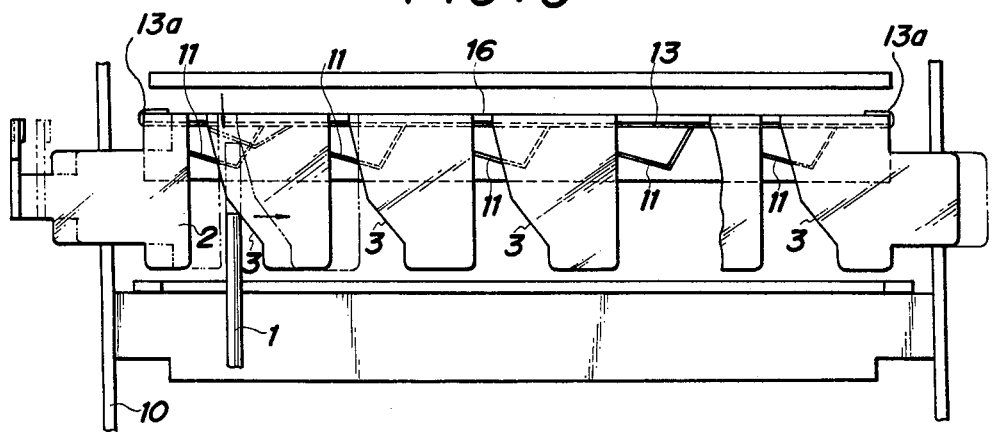
FIG. 3 is a similar fragmentary plan view of a rear or inner portion of a pushbutton tuner showing another mode of means for surely and smoothly restoring button slides to their original positions according to the present invention.
Figure 4:
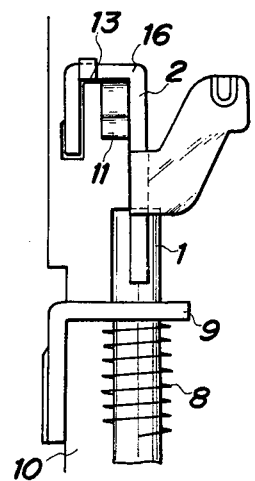
FIG. 4 is a side elevational view of FIG. 3.

FIGS. 3 and 4 show another form of the means for positively restoring the button slides 1 to their original positions according to the present invention. The structure of the tuner assembly of this embodiment is substantially the same as that of the foregoing embodiment except that a resilient member 13 is employed instead of the means 4 for positive resetting of the button slides 1. The resilient member 13 is disposed and secured in a groove 16 formed by the inner or rear folded back portion of the clutch releasing means 2 which is made of an integral plate. The resilient member 13 has end portions 13a—13a which hook around the ends of this clutch plate. The resilient member 13 has a plurality of operative projecting spring portions 11 corresponding to the respective button slides 1. In the so formed structure as shown in FIGS. 3 and 4, it will be seen that the action of the operative projecting spring portions 11 act to push back the button slides cooperates with the operations of both the clutch releasing means 2 and the resilient members which act in the direction to repel the button slide 1 to effectively disengage the button slide from the cams of the clutch releasing means 2. Thus, the resetting of the button slide 1 when the pushbutton is released after completion of the inward pressing operation thereof can be properly and smoothly carried out.

Figure 7:
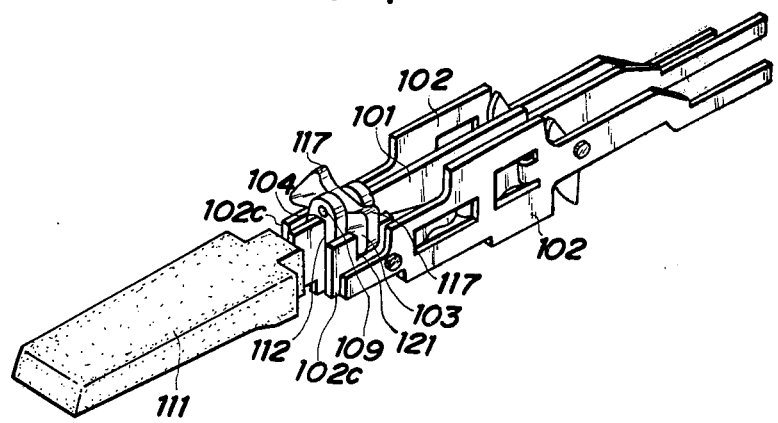
FIG. 7 is a perspective view of a conventional pushbutton selector for multi-band pushbutton tuner.

FIGS. 5 and 6 show an embodiment of the present invention whose means for ensuring smooth and sure restoration of the button slides to their original positions is specifically adapted for multi-band pushbutton tuners. In the pushbutton tuner as shown in FIGS. 5 and 6, pairs of actuating members 102, 102 are disposed on opposite sides of the respective button slides 101 extending therealong. Each such pairs of actuating members 102, 102 is connectable with a tuning mechanism as mentioned below and each of the button slide has a pushbutton 111 secured thereto. An engaging member 103 is mounted on each of the button slides 101 for selectively connecting either one of the associated pair of actuating members 102, 102 to the button slide 101 to move therewith for actuation of the tuning mechanism. A seat 104 for the engaging member 103 is snugly fitted in a notch 112 formed in each of the button slides 101 at its outer end portion. The engaging member 103 is mounted by a pin 109 for movement in a direction perpendicular to the longitudinal direction of the button slide 101 as shown in FIG. 7. The engaging member 103 has a pair of cam portions 117, 117 each of which is adapted to engage with and disengage from one or the other of the notches 121, 121 formed in slidable metal member 102c, 102c which are attached to the respective actuating members 102, 102 by the operation of a switching member 108 for changing the connection between the button slides and the actuating members 102, 102. Thus, the engaging member 103 selectively assumes right or left position to connect the corresponding actuating member 102, 102 to the button slide 1, rendering the connected member operative. In this state, when the pushbutton 111 is pressed inwardly along with the so connected actuating member 102, the actuating member is connected to the tuning mechanism in a manner as well known. Thus, when pressed inwardly, a frequency regulating member 105 (FIG. 6) provided on the operated actuating member 102 will engage a rockable member 106 which extends laterally within the housing 110. Then, the rockable member 106 is caused to assume a position determined according to the set angle of the sector of the engaged frequency regulating member 105, determining the amount to which the core is moved within a coil to select a radio station.

In the thus constructed multi-band tuner, the actuating members 102, 102 are each provided with springs 122, 122 as a spring 123 is mounted on the button slide 101 as mentioned above. Each of the actuating members 102, 102 has, intermediate its ends, a shoulder portion 124 engageable with the housing 110 to regulate the position thereof restored or projected by the action of the spring 122. Thus, the shoulder portion 124 regulates the length of the outer end 102a of each actuating member 102 which projects outwardly from the front face of the housing 110. In this connection, said length of the portion 102a is so determined that the portion 102a may be positioned within the pressing stroke of the pushbutton toward the housing 110. In this connection, it is to be noted that, in the past, it was considered that since each actuating member 102, when connected to a button slide 101 through an engaging member 103, is forcibly moved with the button slide 101, it was advantageous for the portion 102a of the actuating member 102 to have a length only enough to be guided into the housing 110 and engaged with the engaging member 103. Further, it was recognized that an excessively long actuating member 102 projecting from the housing adversely would hinder the operation of the pushbutton 111 for the actuation of the button slide 101. However, in contrast, the outer end portion 2a of each actuating member 102 is so formed that it protrudes within the stroke of the pushbutton 111 in the present invention near the end of the strokes so that the actuating member 102 which is not connected to the button slide 101 is also pressed inwardly by the pushbutton 111 at the end of the pressing stroke.

Thus, as mentioned above, in the operation of a pushbutton 111 not only the actuating member selected by or connected to the button slide 101 but also the actuating member 102 which is not selected by or connected to the button slide 101 is pressed at the last stage of the pressing stroke. Accordingly, when the pushbutton 111 is released, both the springs 122 and 122 cooperate with the spring 123 of the button slide 101 to surely restore the pushbutton 110 to its original projected position. Thus, the button slide 101 can receive relatively strong and uniform restoring force and possible locking of the button slide 101 as is often the case with the conventional tuner can be prevented. It is further to be noted that since the period during which the unselected actuating member moves occurs only during the engagement between the frequency regulating member 105 and the rockable member 106, there is no problem obtaining a proper selection operation. The means for ensuring the resetting of the pushbuttons and the button slides of this embodiment may of course be employed in combination with the similar means as disclosed in the foregoing embodiments.

Figure 8:
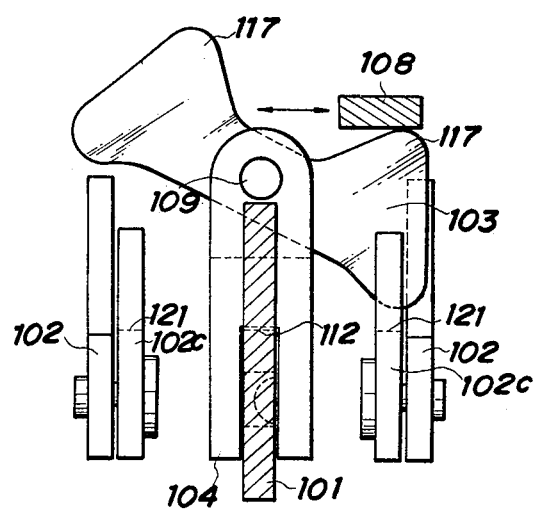
FIG. 8 is an enlarged view of connecting portion of the pushbutton selector of FIG. 7.

The foregoing embodiments especially shown in FIGS. 1 to 4 may be applied to a single-band pushbutton tuner wherein button slides and actuating members for use in a conventional multi-band tuner are employed upon specific adaptation. In the single-band tuner, the pushbutton selectors are each composed of a button slide and actuating member for a multi-band tuner as shown in FIGS. 7 and 8, but each of the button slides 201 is connected to the associated actuating member 202 by means of a specifically formed connector 203 as shown in FIGS. 9 and 10. The connector 203 has a truncated groove 231 facing downwardly and matatable with a notch 211 formed originally in the button slide 201, straddling over the button slide 201. The connector 203 further has at one end thereof a base portion 235 which is adapted to abut against the side wall of the button slide 201. The connector 203 has at its other end a projection 232 which is adapted to register with the notch 221 originally formed in a slidable metal member 202a of the actuating member 202. A semispherical protuberance 233 is formed on a side wall of a groove 231 which is adapted to fit in the opening 212 formed originally on the button slide 201 under the notch 211. At another side wall of the groove 231 is formed an archlike notch 234.

The so constructed connector 203 is used to connect the actuating member 202 to the button slide 201 as shown in FIG. 9 to provide a pushbutton selector for a single station. In order to assemble this pushbutton selector, the seat 104 (FIG. 7) and the engaging member 103 (FIG. 7) are removed from the notches 211 and 221 of the pushbutton selector for the multi-band tuner and the connector 203 is inserted therein, connecting one actuating member to the button slide.

As mentioned above, since the button slides and actuating members for multi-band tuners may also be employed for single-band tuners, not only is production quality facilitated the complexity of but also manufacturing equipment is reduced, enabling manufacturing costs to be reduced.

What is claimed is:

1. In a pushbutton tuner comprising a tuner housing, a tuning mechanism disposed within said housing, a pushbutton selector connectable to said tuning mechanism and including a plurality of button slides disposed sidewise across the front fact of the housing and movable rectilinearly between inoperative initial and operative retracted positions, there being first resilient means for urging said button slides fully into their initial positions, and a plurality of actuating means respectively associated with the button slides and adapted to be connected to the tuning mechanism when pressed inwardly, a clutch adapted to connect a manual tuning selector to the tuning mechanism, and clutch releasing means adapted to release the clutch and having portions engaged by said actuating means to release the clutch when any of the button slides is pressed inwardly; the improvement which comprises button slide urging means including second resilient means operative near the end of the path of travel of any button slide to its retracted position to urge the button slide toward its initial position.

2. A pushbutton tuner of claim 1, wherein said engaged portions of said clutch releasing means comprise a plurality of cam surfaces each adapted to engage with one of the button slides, and said button slide urging means is a spring-urged member having a plurality of cam surfaces which engage said button slides after said clutch releasing means is operated thereby, and said first resilient means is a spring mounted between the housing and each button slide to urge the button slide to its initial position.

3. A pushbutton tuner of claim 2, wherein said clutch releasing means has elongated slots and said button slides urging means has pins each slidably received in the respective slots for interconnection therebetween.

4. A pushbutton tuner of claim 1, wherein said clutch releasing means has a plurality of cam surfaces respectively adapted to engage with the actuating means of the respective button slides when the latter are pressed inwardly to their retracted positions, and said button slide urging means has a resilient member interconnected with said clutch releasing means for cooperation therewith and provided with a plurality of operative resilient portions constituting said second resilient means respectively engageable with the actuating means of the respective button slides in their retracted positions to urge the actuating means and button slides associated therewith to their initial positions and disengage them from the cam surfaces of said clutch releasing means.

5. A pushbotton tuner of claim 4, wherein said clutch releasing means has a groove for receiving the resilient member therein.

6. A pushbutton tuner of claim 1, wherein said actuating means include a pair of actuating members associated with each button slide and are disposed on opposite sides thereof and extend therealong, each of said button slides has an engaging member for selectively connecting one or the other actuating member thereto to move therewith, said second resilient means are compression springs mounted on the respective actuating members, and each of said actuating members has an extension in the path of movement of the associated button slide to its retracted position for actuation of the compression spring irrespective of the connection of the actuating member with the button slide.

7. A pushbutton tuner of claim 1, wherein each of said button slides has a notch for accomodating a seat of an engaging member for selectively connecting one or the other of the actuating members, and each of said actuating members has a notch for receiving said engaging member; and which further comprises a connector having a groove for snugly inserting the connector in said notch of the button slide, a base portion formed on one side of said groove for abutment against the side wall of the button slide and a projection engageable with said notch formed in the actuating member, thereby to form a pushbutton selector for tuning a station in a single band.

8. In a pushbutton tuner comprising a tuner housing, a tuning mechanism disposed within said housing, a pushbutton selector connectable to said tuning mechanism and including a plurality of button slides disposed sidewise across the front face of the housing and movable rectilinearly between inoperative initial and operative retracted positions, a plurality of actuating members respectively associated with the button slides and adapted to be connected to the tuning mechanism when pressed inwardly, a clutch adapted to connect a manual tuning selector to the tuning mechanism, and clutch releasing means adapted to release the clutch when any of the button slides is pressed inwardly; the improvement wherein these are two of said actuating members disposed on opposite sides of and extend along each button slide, each of said button slides has an engaging member for selectively connecting one or the other actuating member thereto to move therewith, and separate resilient means mounted on each actuating member for urging the actuating member to an initial position, and each of said actuating members having an extension in the path of movement of the associated button slide near the end of its stroke to its retracted position so that the resilient means associated therewith will provide a return force on the associated button slide irrespective of the connection of the actuating member with the button slide.

* * * * *